United States Patent [19]

Hirata et al.

[11] Patent Number: 4,952,423
[45] Date of Patent: Aug. 28, 1990

[54] PRODUCTION OF A TRANSPARENT ELECTRIC CONDUCTOR

[75] Inventors: Masahiro Hirata, osaka; Masao Misonou, Hyog; Hideo Kawahara, Osaka, all of Japan

[73] Assignee: Saint-Gobain Recherche, Aubervilliers Cedex, France

[21] Appl. No.: 148,827

[22] Filed: Jan. 27, 1988

[30] Foreign Application Priority Data

Jan. 27, 1987 [JP] Japan ................... 62-16387

[51] Int. Cl.$^5$ .................... B05D 5/12; B05D 5/06
[52] U.S. Cl. ..................... 427/109; 427/108; 427/110; 427/126.3; 427/165; 427/166; 427/167; 427/168; 427/169; 427/255; 427/255.2; 427/377; 427/294
[58] Field of Search ............... 427/108-110, 427/255, 126.3, 294, 165-169, 377, 255.2

[56] References Cited

U.S. PATENT DOCUMENTS

| | | | |
|---|---|---|---|
| 2,954,454 | 11/1960 | Gaiser | 219/19 |
| 3,081,200 | 3/1963 | Tompkins | 427/126.3 |
| 3,108,019 | 3/1963 | Davis | 427/160 |
| 3,252,829 | 5/1966 | Romstadt et al. | 427/108 |
| 3,506,556 | 2/1970 | Gillery | 204/192 |
| 4,146,657 | 5/1979 | Gordon | 427/126 |
| 4,172,159 | 10/1979 | Marcault | 427/160 |
| 4,238,276 | 12/1980 | Kinugawa et al. | 427/108 |
| 4,252,841 | 2/1981 | Kinugawa et al. | 427/108 |
| 4,329,016 | 5/1982 | Chen | 427/108 |
| 4,342,792 | 8/1982 | Brown et al. | 427/126.3 |
| 4,395,467 | 5/1983 | Vossen | 428/697 |
| 4,490,227 | 3/1984 | Bitter | 204/192 |
| 4,500,567 | 3/1985 | Kato | 427/255.3 |
| 4,504,522 | 5/1985 | Kaiser et al. | 427/126.3 |
| 4,521,446 | 6/1985 | Coleman et al. | 427/126.3 |
| 4,533,571 | 1/1985 | Kramer | 427/180 |
| 4,562,095 | 2/1985 | Coulon | 427/180 |
| 4,568,578 | 2/1986 | Arfsten et al. | 427/108 |
| 4,617,206 | 10/1986 | Haisma et al. | 427/126.3 |
| 4,650,557 | 3/1987 | Bitter | 427/108 |
| 4,696,837 | 2/1987 | Lindner | 427/255.3 |
| 4,707,383 | 6/1987 | Mattes | 427/168 |
| 4,776,870 | 10/1988 | Meyer et al. | 427/165 |

*Primary Examiner*—Janyce Bell
*Attorney, Agent, or Firm*—Pennie & Edmonds

[57] ABSTRACT

The invention relates to the production of transparent electric conductors.

According to the invention, a doped tin oxide layer formed by CVD is heat-treated to improve its conductivity.

9 Claims, No Drawings

PRODUCTION OF A TRANSPARENT ELECTRIC CONDUCTOR

FIELD OF THE INVENTION

This invention relates to the production of a transparent electric conductor with low electrical resistance and high optical transparency.

More precisely, the invention relates to the production of a transparent electric conductor consisting of a substrate having a transparent electrically conductive layer made up principally of tin oxide formed thereon.

Such transparent electric conductors are used in solar cells, in liquid crystal display elements, in electroluminescent elements, as transparent heating surfaces for vehicle windows, etc.

BACKGROUND OF THE INVENTION

It is known to make transparent conductive layers by deposition on glass substrates. Such layers, for example, may have a base of tin oxide doped with flourine or antimony, or a base of indium doped with tin (ITO).

These layers are obtained by pyrolysis of liquid, powder or gaseous compounds, or by vacuum evaporation, magnetron sputtering, etc.

The pyrolyzed layers, particularly those comprising a tin oxide base, are highly resistant to chemical attack, exhibit good mechanical strength and are formed of relatively inexpensive raw materials.

On the other hand, the electrical resistance of such layers is relatively high, which is an inconvenience for certain desired applications.

SUMMARY OF THE INVENTION

This invention solves the problem of unduly high electrical resistance of pyrolyzed thin layers by providing a new process for making them.

The invention comprises a process including the step of heat treatment of conductive layers after pyrolytic deposition on a glass substrate.

The invention applies more particularly to layers with a tin oxide base.

The heat treatment is performed on a raw deposited layer, i.e., without any treatment after deposit.

DESCRIPTION OF THE PREFERRED EMBODIMENTS

According to the invention, a thin layer made up essentially of tin oxide is deposited on a transparent support, especially of glass. This is done by disposing a composition comprising at least a tin compound and a doping agent, particularly fluorine, on a support heated to high temperature.

Upon contact with the hot support, the composition decomposes and oxidizes to form a thin tin oxide layer.

According to the invention, there can be used as the tin compound: $C_4 H_9 S_n$, $S_n Cl_4$, $(CH_3)_2 S_n Cl_2$, $(C_n H_{2n+1})_4 Sn$ where n=1, 2, 3 or 4, $(CH_3)_2 Sn H_2$, $(C_4 H_9)_3 Sn H$, $(C_4 H_9)_2 Sn (COOCH_3)_2$, etc.

As the fluorine doping agent it is possible to use $CH_3CHF_2$, $CH_3 CClF_2$, $CHClF_2$, $CHF_3$, $CF_2Cl_2$, $CF_3Cl$, $CF_3BR$, etc.

It is also possible to use other compounds, for example, compounds containing both tin and fluorine.

Pyrolysis of the composition in contact with the heated transparent substrate may involve several known methods. CVD (chemical vapor deposition) is preferred. In CVD, one or more compositions containing the tin and fluorine, in vapor form, are brought into contact with a substrate heated to a temperature on the order of 400° to 650° C. A thin layer of tin oxide doped with fluorine is then deposited.

According to the invention, after deposition a heat treatment of the resulting layer is performed under normal or reduced pressure, preferably in a neutral or reducing atmosphere, for example, under an $H_2$ or $N_2$ atmosphere, or under a mixture of $H_2 + N_2$. This treatment can also be performed in a vacuum. This heat treatment is performed at a temperature below that of the deposition of the electroconductive layer, i.e., at a temperature below 400° C. Preferably the treatment temperature is carried out between 250° and 350° C. By this treatment, the surface of the electroconductive layer is slightly reduced and its electrical conductivity is improved.

The invention will now be explained with the help of the following nonlimiting examples.

EXAMPLE 1

Alkali-lime glass plates used as transparent supports were coated with a tin oxide layer. These glass plates were 1.1 mm thick and their size was 25 mm×30 mm. Before coating they were thoroughly washed and dried.

A gas mixture of tin tetrachloride, steam, oxygen, 1,1-difluoroethane, and nitrogen was used as the CVD coating composition. An $SnO_2/F$ layer (tin oxide doped with F) was deposited on the glass plates. The glass was heated to 550° C. before deposition.

This resulted in a layer on the substrate 2000 angstroms thick, with a per square resistance of 25 ohms ($R_o$).

Heat treatments according to the invention were performed on several of these samples for 30 minutes in an $H_2$ atmosphere at 300° C. The pressure of gas in the chamber in which the treatment was performed was varied from sample to sample. Then the per-square resistance $R_1$ was measured.

The results obtained are noted in table 1, below. As shown by the table of ratios $R_1/R_o$, it was found that the electrical resistance of the layers was lowered by the heat treatment. Moreover, it was found that the light transmission of the coated substrate was not affected by the heat treatment.

EXAMPLE 2

As in example 1, an $SnO_2/F$ layer was deposited on several transparent supports. The thickness of the layers on the samples was 2000 angstroms and the per square electrical resistance Ro was 25 ohms. In this case, the temperature of the heat treatment performed according to the invention was varied from sample to sample.

The heat treatment of the samples was performed in each case at a pressure of 124 Pa for 10 minutes in an $N_2$ atmosphere. Then the per square electrical resistance ($R_2$) of the samples thus treated was measured. The ratios $R_2/R_o$ were then calculated.

The results obtained are indicated in table 2, below. As shown, the heat treatment reduced the electrical resistance of the $SnO_2/F$ layer, and the lowest resistance was obtained with treatment temperatures on the order of 250 to 350° C. The optical transmission was not affected by the heat treatment.

EXAMPLE 3

As in example 1 and 2, an $SnO_2/F$ layer was deposited on several transparent glass substrates. The thickness of the layers on the substrates was 2000 angstroms, and the per square resistance ($R_o$) was 25 ohms.

In this case, the gas pressure to which the samples were exposed during heat treatment was varied from one sample to the next; in each case, the heat treatments were performed at 300° C for 10 minutes in an $H_2$ atmosphere. Then, the square resistance ($R_3$) of the samples thus treated under different pressures was measured and the ratios $R_3/Ro$ were obtained.

The results obtained are indicated in table 3, below. As shown, it was possible to reduce the electrical resistance of the $SnO_2/F$ layer by heat treatment under reduced pressure. No change in the optical transmission characteristics due to the heat treatment was observed.

EXAMPLE 4

As in the preceding examples, an $SnO_2/F$ layer was deposited on several substrates. The thickness of the layers was 2000 angstroms and the electrical resistance (Ro) was 25 ohms per square.

Heat treatments were performed at a pressure of 33 Pa for 10 minutes in an $H_2$ atmosphere; the temperature was varied from one sample to the next. Then, the electrical resistance (R4) of the samples thus treated was measured and the ratio R4/Ro were calculated.

The results obtained are indicated in table 4, below. As shown, the heat treatment reduced the electrical resistance of the $SnO_2/F$. No change in the optical transmission characterstics due to the heat treatment was observed. The lowest resistances were obtained for treatments at a temperature between 250° and 350° C.

EXAMPLE 5

As in example 1, an $SnO_2/F$ layer was deposited onto a glass substrate. The thickness of the layer on the substrates was 2000 angstroms and the electrical resistance was 25 ohms per square. A heat treatment was performed at 320°C. under a vacuum of $1.76 \times 10^{-3}$ Pa for 100 minutes. The electrical resistance $R_5$ after the heat treatment was 21.6 ohms per square so that $R_5/Ro=0.86$. It is clear that by this heat treatment the surface resistance of the $SnO_2/F$ layer was reduced. No change of the optical transmission characteristics occurred due to the heat treatment.

Therefore, according to the invention, by heat treating of the transparent electroconductive layer, it is possible to obtain a transparent electric conductor with reduced electrical resistance and high optical transparency.

TABLE 1

| Samples | Pressure (Pa) | R1/Ro |
|---|---|---|
| 1 | 36 | 0.91 |
| 2 | 124 | 0.86 |
| 3 | 309 | 0.86 |
| 4 | Normal Pressure | 0.88 |

TABLE 2

| Sample | Temperature (°C.) | R2/Ro |
|---|---|---|
| 5 | 200 | 0.96 |
| 6 | 250 | 0.96 |
| 7 | 300 | 0.88 |
| 8 | 350 | 0.88 |
| 9 | 400 | 1.00 |

TABLE 3

| Samples | Pressure (Pa) | R2/Ro |
|---|---|---|
| 10 | 13 | 0.92 |
| 11 | 33 | 0.92 |
| 12 | 80 | 0.95 |
| 13 | Normal pressure | 1.02 |

TABLE 4

| Samples | Temperature (°C.) | R4/Ro |
|---|---|---|
| 14 | 200 | 0.98 |
| 15 | 250 | 0.95 |
| 16 | 300 | 0.90 |
| 17 | 350 | 0.90 |
| 18 | 400 | 0.96 |

While a preferred embodiment of the invention has been described, the invention should not be limited thereby, but only by the following claims.

We claim:

1. A method for manufacturing a transparent, electrically conductive member, by forming an electrically conductive layer on a transparent substrate, comprising the steps of:
   heating the substrate to a first deposition temperature;
   thermally decomposing and oxidizing a tin compound in the vicinity of the substrate under conditions such that a tin oxide layer is deposited on the substrate;
   bringing a halogen containing doping material into the vicinity of the substrate during the deposition step, whereby said tin oxide layer is doped as it is deposited; and
   without thereafter raising the temperature of the deposited doped layer above the deposition temperature, performing a heat treatment on the doped tin oxide layer at a temperature between 250° C. to 400° C.

2. The method of claim 1, wherein the heat treatment is performed at atmospheric or reduced pressure.

3. The method of claim 1, wherein the heat treatment is performed under an $H_2$, $N_2$, or $H_2$ and $N_2$ atmosphere.

4. The method of claim 1, wherein the layer is deposited by pyrolysis from liquid, gas or solid precursor materials.

5. The method of claim 1, wherein the layer is deposited by chemical vapor deposition.

6. The process of claim 1 wherein said halogen with which the layer is doped is fluorine.

7. The process of claim 1, wherein said doped tin oxide layer is formed by exposing said heated substrate to a mixed vapor consisting of a halogen-containing doping material and the constituents of the desired tin oxide compound.

8. The method of claim 1, wherein the transparent substrate is comprised of glass.

9. The method of claim 1, wherein the heat treatment is performed at a temperature between about 250° C. and 350° C.

* * * * *